(12) United States Patent
Himori et al.

(10) Patent No.: US 7,104,217 B2
(45) Date of Patent: *Sep. 12, 2006

(54) PLASMA PROCESSING APPARATUS

(75) Inventors: Shinji Himori, Nirasaki (JP); Toshiki Takahashi, Nirasaki (JP); Takumi Komatsu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/273,000

(22) Filed: Oct. 18, 2002

(65) Prior Publication Data

US 2003/0086840 A1 May 8, 2003

Related U.S. Application Data

(63) Continuation of application No. PCT/JP01/03245, filed on Apr. 16, 2001.

(30) Foreign Application Priority Data

Apr. 18, 2000 (JP) .......................................... 2000-116304

(51) Int. Cl.
*C23C 16/00* (2006.01)
*C23C 14/34* (2006.01)
*H01L 21/306* (2006.01)

(52) U.S. Cl. ............................. 118/723 E; 118/723 ER; 156/345.34; 156/345.43; 156/345.47; 204/298.07; 204/298.33; 204/298.34

(58) Field of Classification Search ............. 118/723 E, 118/723 ER; 156/345.33, 345.34, 345.38, 156/345.43, 345.44, 345.45, 345.46, 345.47; 204/298.07, 298.33, 298.34
See application file for complete search history.

(56) References Cited

U.S. PATENT DOCUMENTS

| 4,148,705 | A | | 4/1979 | Battey et al. .......... 204/192.35 |
|---|---|---|---|---|
| 5,074,456 | A | * | 12/1991 | Degner et al. .............. 228/121 |
| 6,110,287 | A | * | 8/2000 | Arai et al. ............. 156/345.34 |
| 6,228,438 | B1 | * | 5/2001 | Schmitt ...................... 427/569 |
| 2003/0155078 | A1 | * | 8/2003 | Ogasawara et al. .... 156/345.47 |

FOREIGN PATENT DOCUMENTS

| EP | 1193746 | * | 4/2002 |
|---|---|---|---|
| JP | 05-29137 | | 4/1993 |
| JP | 2000-77384 | | 3/2000 |
| JP | WO 00/68985 | | 11/2000 |

OTHER PUBLICATIONS

International Search Report, PCT/JP01/03245, Jul. 24, 2001.

* cited by examiner

*Primary Examiner*—Rodney G. McDonald
(74) *Attorney, Agent, or Firm*—Oblon, Spivak, McClelland, Maier & Neustadt, P.C.

(57) ABSTRACT

The present invention provides a plasma processing apparatus having an electrode plate arranging therein, an upper electrode to which a dielectric member or a cavity portion is provided, a dimension or a dielectric constant of which is determined in such a manner that resonance is generated at a frequency of high-frequency power supplied to the center of the back side and an electric field orthogonal to the electrode plate is generated, and a susceptor as a lower electrode so as to be opposed to each other, in order to reduce unevenness of an electric field distribution on the surface of the electrode in a plasma processing using a high-density plasma capable of coping with further refinement.

21 Claims, 7 Drawing Sheets

PLASMA PROCESSING APPARATUS

CROSS-REFERENCE TO RELATED APPLICATIONS

This is a Continuation Application of PCT Application No. PCT/JP01/03245, filed Apr. 16, 2001, which was not published under PCT Article 21(2) in English.

This application is based upon and claims the benefit of priority from the prior Japanese Patent Application No. 2000-116304, filed Apr. 18, 2000, the entire contents of which are incorporated herein by reference.

BACKGROUND OF THE INVENTION

1. Field of the Invention

The present invention relates to a plasma processing apparatus which applies a plasma processing on a substrate such as a semiconductor substrate.

2. Description of the Related Art

In a semiconductor device manufacturing process, a plasma processing such as etching, sputtering or CVD (chemical vapor deposition) has been conventionally heavily used for a semiconductor wafer which is a substrate to be processed.

As a plasma processing apparatus which performs such a plasma processing, various kinds of apparatuses are used, but a capacitive coupling type parallel plate plasma processing apparatus (which will be referred to as a plasma processing apparatus hereinafter) is used in particular.

In this plasma processing apparatus, a pair of parallel plate electrodes (upper and lower electrodes) are arranged in a chamber, an exhaust system is connected, and a high-frequency power supply is connected to the parallel plate electrodes. This plasma processing apparatus brings a process gas into the chamber in which a vacuum is formed by exhaust, a high-frequency voltage is applied to at least one of the electrodes in order to form a high-frequency electric field between the electrodes, a plasma having a process gas atmosphere is formed by this high-frequency electric field, thereby performing a plasma processing with respect to a semiconductor wafer.

In the etching of a film formed on the semiconductor wafer, e.g., an oxide film by using such a capacitive coupling type parallel plate plasma processing apparatus, a low vacuum is formed in the chamber, and a plasma with a medium density is formed, thus enabling preferable to a radical control. Based on this, an appropriate plasma state can be obtained, and hence highly stable and reproducible etching can be realized with a high selectivity.

In recent years, refinement of design rules in the ULSI has further advanced, and a higher aspect ratio of a hole shape has been demanded. However, conventional etching conditions and oxide films, etc. do not satisfy this requirement.

Thus, an attempt has been made to increase the frequency of high-frequency power applied to the above-described parallel plate electrodes and form a high-density plasma while maintaining an excellent plasma dissociation state. Since an adequate plasma can be consequently formed under conditions of a lower voltage, it is possible to adequately cope with further refinement of the design rules.

Meanwhile, according to studies conducted by the present inventor, since the upper electrode is formed of a conductor or a semiconductor in plasma processing apparatuses, it was found that the following disadvantages are generated.

As described above, when an application frequency is increased in order to form the high-density plasma, the inductance on the electrode surface to which a high frequency is applied cannot be ignored, the electric field becomes stronger at the center of the electrode, and the electric field distribution in the radial direction becomes uneven. When the electric field distribution becomes uneven, the plasma density becomes uneven, and the etching rate distribution also becomes uneven. Therefore, it is required to eliminate factors which produce unevenness of the electric field distribution, and thus make the etching rate distribution even.

However, problems in the conventional method using high-density plasma are not necessarily clearly recognized, and the attempt to eliminate unevenness of the electric field distribution is insufficient at the plasma processing.

BRIEF SUMMARY OF THE INVENTION

Accordingly, it is an object of the present invention to provide a plasma processing apparatus which can reduce unevenness of an electric field distribution on an electrode surface and generate a uniform plasma in a plasma processing using high-density plasma which can cope with further refinement of process.

According to the present invention, there is provided a plasma processing apparatus which includes a chamber which is pressure-reduced by an exhaust system and used for applying a plasma processing to a substrate to be processed held by a second electrode by using the plasma generated by high-frequency power in a process gas atmosphere between a first electrode and the second electrode provided so as to be opposed to each other in parallel, wherein the first electrode is constituted by a conductive support which is held in the chamber by interposing an insulator and has a process gas introducing/diffusing function and a high-frequency power introducing function, an electrode plate composed of a flat plate formed by a conductor or a semiconductor joined to a surface of the support on the side opposed to the second electrode, and a dielectric member fitted in a concave portion formed at the center on the surface of the support on the side joined to the electrode plate, and a dimension and a dielectric constant of the dielectric member are determined in such a manner that a resonance is generated at a frequency of high-frequency power to be supplied and an electric field orthogonal to the electrode plate is generated.

Further, according to the present invention, there is provided a plasma processing apparatus which includes a chamber which is pressure-reduced by an exhaust system and used for applying a plasma processing to a substrate to be processed held by a second electrode by using the plasma generated by high-frequency power in a process gas atmosphere between a first electrode and the second electrode provided so as to be opposed to each other in parallel, wherein the first electrode is constituted by a conductive support which is held in the chamber by interposing an insulator and has a process gas introducing/diffusing function and a high-frequency power introducing function, an electrode plate composed of a flat plate formed by a conductor or a semiconductor joined to a surface of the support on the side opposed to the second electrode, and a cavity portion formed at the center of the surface of the support on the side joined to the electrode plate, and a dimension of the cavity portion member is determined in such a manner that a resonance is generated at a frequency of high-frequency power to be supplied and an electric field orthogonal to the electrode plate is generated.

In the above-described plasma apparatus, it is preferable that a skin depth δ in the electrode plate represented by the following expression (1) is larger than a thickness of the electrode plate:

$$\delta = (2\rho/\omega\mu)^{1/2} \quad (1)$$

wherein ω: an angular frequency of high-frequency power (=2πf (f: frequency)), ρ: a resistivity of the electrode plate, and μ: a magnetic permeability of the electrode plate. At this moment, it is preferable that the resistivity of the electrode plate is not less than 0.1 Ω·m, and 0.3 to 0.8 Ω·m. Furthermore, it is preferable that the relative dielectric constant of the dielectric member is 1 to 10.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A preferred embodiment according to the present invention will now be described in detail hereinafter with reference to the accompanying drawings.

Figure 1:
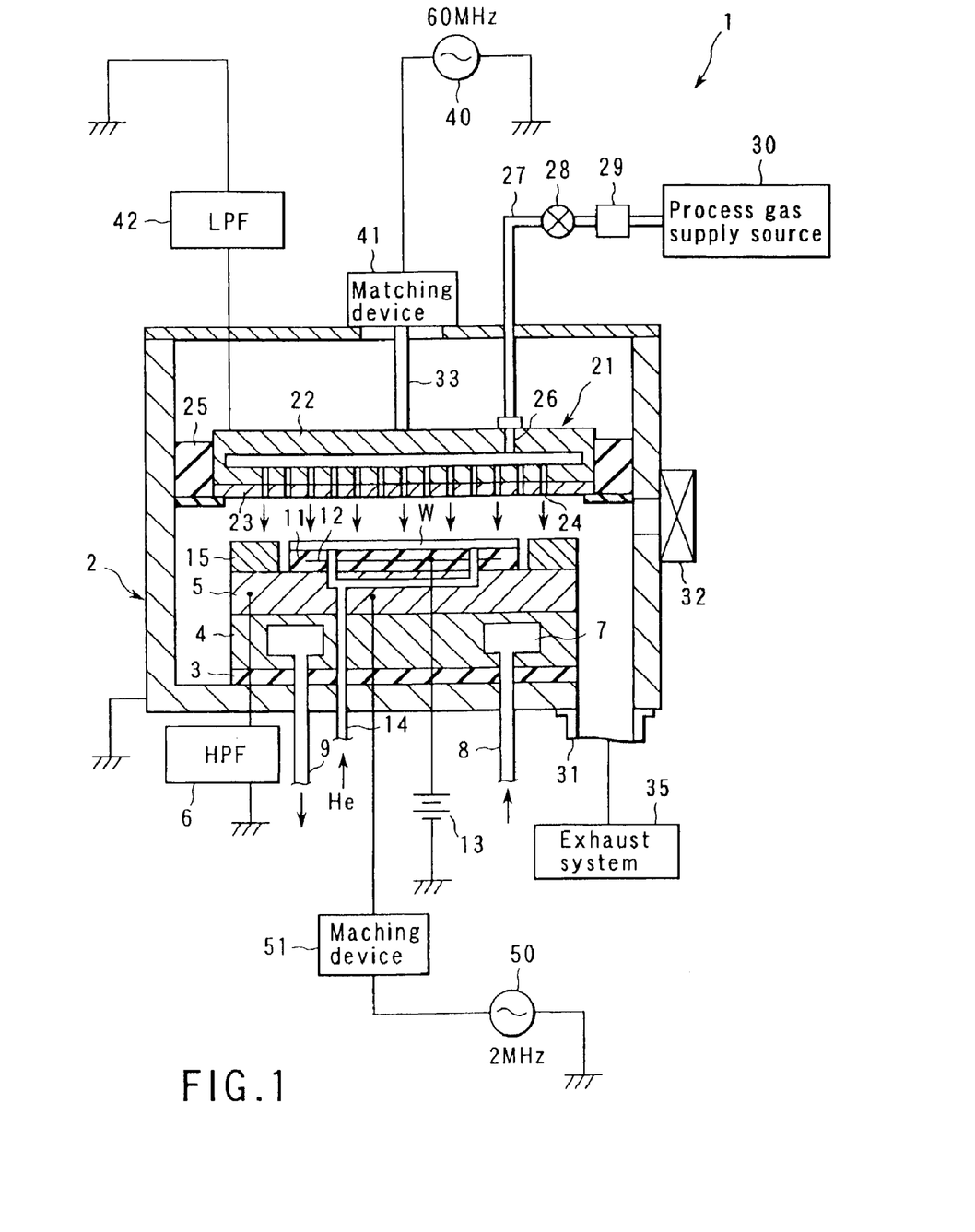
FIG. 1 is a cross-sectional view showing a plasma processing apparatus according to an embodiment of the present invention.

FIG. 1 is a view showing a sectional structural example of a plasma processing apparatus according to an embodiment of the present invention. This plasma processing apparatus 1 is constituted as a capacitive coupling type parallel plate etching apparatus in which electrode plates are opposed to each other in the vertical direction in parallel and a plasma formation power supply is connected to one of the electrode plates.

This plasma processing apparatus 1 has a chamber 2 whose surface consists of, e.g., aluminium subjected to an alumite coating (anodizing) and which is molded into, e.g., a cylindrical shape. This chamber 2 is grounded. Of course, the chamber 2 is not restricted to the cylindrical shape, and it may have a cubic shape.

On the bottom in the chamber 2 is provided a substantially cylindrical susceptor support base 4 used for mounting a target object, e.g., a semiconductor wafer (which will be referred to as a "wafer" hereinafter) W interposed an insulating plate 3 formed of ceramics or the like. Moreover, a susceptor 5 comprising the lower electrode is provided on the susceptor support base 4. A high-pass filter (HPF) 6 is connected to this susceptor 5.

A refrigerant chamber 7 is provided in the susceptor support base 4. A refrigerant is led into the refrigerant chamber 7 through a refrigerant inlet pipe 8 and discharged from a refrigerant exhaust pipe 9 so that it is circulated. This cools down the entire lower electrode and maintains the processing surface of the wafer W at a desired temperature.

The susceptor 5 is molded into a discoid shape, and an electrostatic chuck 11 having substantially the same shape as the wafer W is provided on the susceptor 5. The electrostatic chuck 11 is constituted by providing the electrode 12 in an insulating material. When a direct-current voltage of, e.g., 1.5 kV is applied from the direct-current power supply 13 to the electrode 12, a coulomb force is generated, and the wafer W is electro-statically attracted to the susceptor. Moreover, a gas passage 14 which pierces the insulating plate 3, the susceptor support base 4, the susceptor 5 and the electrostatic chuck 11 is formed, and a heat transfer medium, e.g., He gas or the like is supplied. With this heat transfer medium, the wafer W (processing surface) is directly subjected to temperature control from the back side.

An annular focus ring 15 used for improving evenness of etching is arranged on the upper peripheral edge of the susceptor 5 so as to surround the wafer W mounted on the electrostatic chuck 11. This focus ring 15 is formed of a conductive material such as silicon.

The upper electrode 21 is provided so as to be opposed to the susceptor 5 in parallel. This upper electrode 21 is fixed to the inside of the chamber 2 by an insulating member 25 arranged on the outer peripheral side, and constitutes a surface opposed to the susceptor 5 as the lower electrode. This upper electrode 21 is comprised by an electrode plate 23 having many discharge holes 24 and an electrode support 22 having a water cooling structure which is provided on a surface of the electrode plate 23 on the side opposite to the susceptor 5, supports the electrode plate 23 and consists of a conductive material, e.g., aluminium whose surface is subjected to alumite coating. The detailed structure of this electrode 21 will be described later. The susceptor 5 and the upper electrode 21 are separated from each other by a distance of approximately 10 to 60 mm, for example.

A gas inlet opening 26 is provided in the electrode support 22 in the upper electrode 21, and a gas supply pipe 27 is connected to the gas inlet opening 26. This gas supply pipe 27 is connected to a process gas supply source 30 via a valve 28 and a massflow controller 29, and comprises a gas supply line. The process gas used for the plasma processing, e.g., an etch processing is supplied from the process gas supply source 30 to the upper electrode 21.

As the process gas, a conventionally used well-known gas can be adopted, and a gas containing a halogen element such as a fluorocarbon gas ($C_xF_y$) or a hydro fluorocarbon gas ($C_pH_qF_r$) can be used, for example. Further, Ar, He or the like, or $N_2$ may be adjuncted. Incidentally, although one gas supply line is illustrated in FIG. 1, the number of gas supply lines can be increased in accordance with the type of gas to be used, and the gas supply lines may be individually provided in accordance with each process gas, and the gases mixed in the chamber 2.

An exhaust pipe 31 is connected to the bottom of the chamber 2, and an exhaust system 35 is connected to this exhaust pipe 31. The exhaust system 35 having a vacuum pump such as a turbo molecule pump, and is thereby constituted so as to be capable of drawing a vacuum to an atmosphere in which a predetermined pressure is reduced, e.g., a predetermined pressure not more than 1 Pa in the chamber 2. Incidentally, although not shown, a pressure regulation valve is provided in the middle of the exhaust pipe 31 or in the exhaust system, and the degree of the vacuum in the chamber is adjusted based on the ratio of opening of the valve. In addition, a gate valve 32 is provided on the side wall of the chamber 2, and the wafer W is carried to/from an adjacent load lock chamber (not shown) while the gate valve 32 is opened.

A feeder rod 33 is provided at the center on the internal upper surface of the upper electrode 21, a first high-frequency power supply 40 is connected to this feeder rod 33 through a matching device 41 provided on the outside upper surface, and a high-frequency voltage is applied to the upper electrode 21. Additionally, a low-pass filter (LPF) 42 is connected to the upper electrode 21. The first high-frequency power supply 40 has a frequency in a range of 27 to 150 MHz, and the high-density plasma with the preferable dissociation state can be formed in the chamber 2 by applying the high-frequency, thereby enabling the plasma processing under the low-voltage condition. In this example, as the high-frequency power supply 40, a power supply of 60 MHz is used.

The susceptor 5 is connected to a second high-frequency power supply 50 through the matching device 51 by a feeder line. This second high-frequency power supply 50 outputs a power supply voltage having a frequency which falls in a range of 1 to 4 MHz, and the appropriate ion action can be given by using a frequency in this range without damaging the wafer W. In this example, as the second high-frequency power supply 50, a power supply of 2 MHz is used.

The structure of the upper electrode 21 will now be described in detail.

Figure 2:
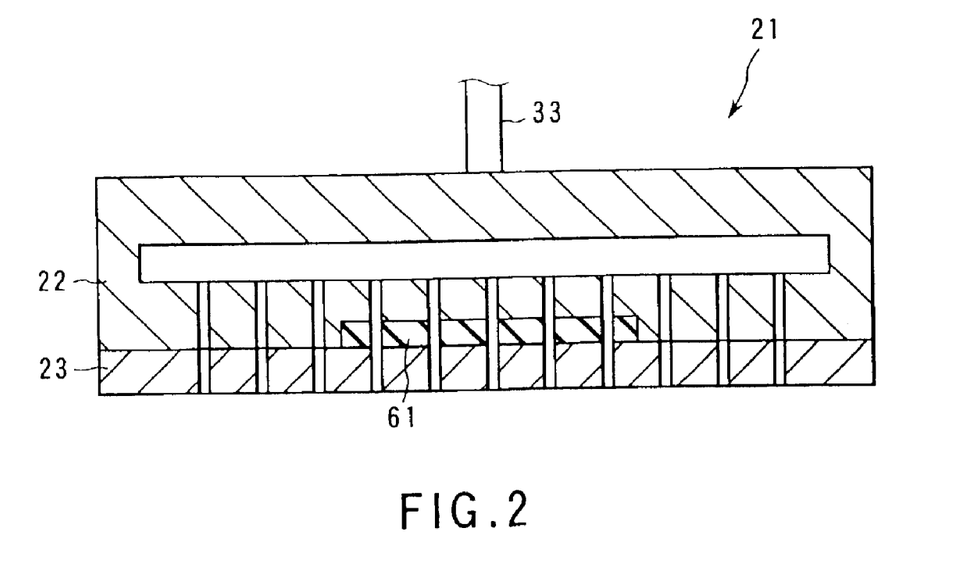
FIG. 2 is a cross-sectional view typically showing a first example of an upper electrode.

FIG. 2 is a cross-sectional view showing a first structural example of the upper electrode 21. In this example, a recess hole is formed at the center of the electrode support 22 provided to the back side of the electrode plate 23 (surface opposite to the susceptor 5), and a dielectric member 61 is fitted in this recess portion so as to come into contact with the electrode plate 23. The dimensions and dielectric constant of this dielectric member 61 are determined so that the resonance is generated with respect to a frequency of the high-frequency power supplied to the upper electrode 21 and an electric field orthogonal to the electrode plate 23 is produced.

When the resonance is generated to the dielectric member 61 and the electric field orthogonal to the electrode plate 23 is produced, the electric field of the dielectric member 61 and the electric field of the electrode 23 are coupled, and the electric field of the dielectric member 61 can be used to control the electric field of the electrode plate 23 directly below the dielectric member 61, i.e., at the center of the electrode. As the dielectric member 61, a member having a relative dielectric constant of 1 to 10 is preferable. As a member which demonstrates a relative dielectric constant in this range, there are quartz (relative dielectric constant: 3 to 10), ceramics such as alumina or aluminium nitride (relative dielectric constant: 5 to 10), and resin such as Teflon or polyimide (relative dielectric constant: 2 to 3).

Figure 3:
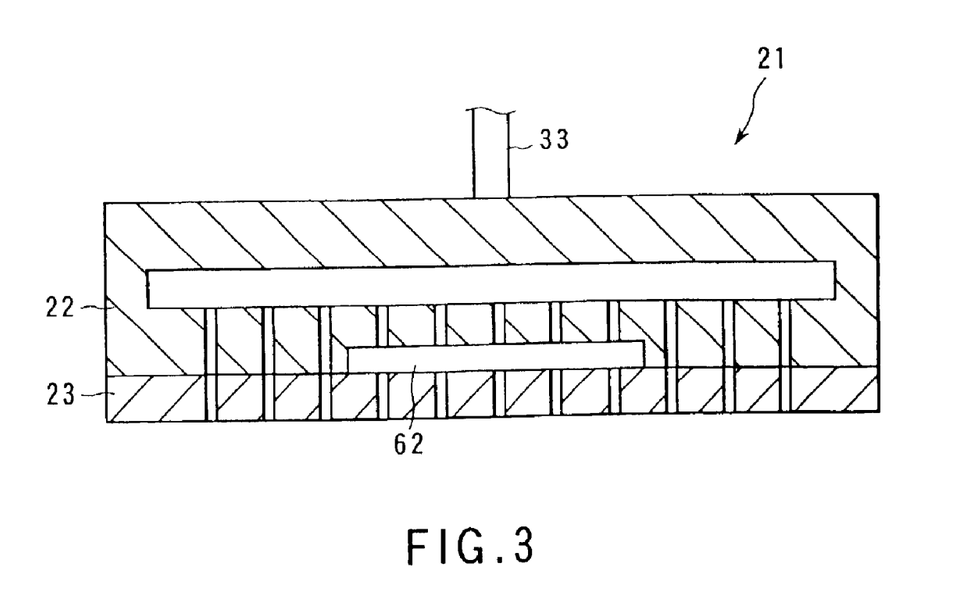
FIG. 3 is a cross-sectional view typically showing a second example of the upper electrode.

FIG. 3 is a cross-sectional view showing a second structural example of the upper electrode 21. In this example, a cavity portion 62 is provided at the center on the back side of the electrode plate 23 supported by the electrode support 22 so as to come into contact with the electrode plate 23. This cavity portion 62 functions as a dielectric (relative dielectric constant=1), and its dimensions are determined in such a manner that the resonance is generated with respect to a frequency of the high-frequency power supplied to the upper electrode 21 and an electric field orthogonal to the electrode plate 23 is produced therein. When the resonance is generated in the cavity portion 62 and the electric field orthogonal to the electrode plate 23 is produced in this manner, the electric field of the cavity portion 62 and the electric field of the electrode 23 are coupled, and the electric field in the electrode plate 23 directly below the cavity portion 62, i.e., at the center of the electrode can be controlled by using the electric field of the cavity portion 62.

As described above, in order to couple the electric field of the dielectric member 61 or the cavity portion 62 with the electric field of the electrode 23, it is preferable that the thickness of the electrode plate 23 from the electrode plate surface (lower surface of the electrode plate) at the part to which the high-frequency power is supplied, namely, the skin depth δ represented by the following expression (1) is larger than the thickness of the electrode plate 23:

$$\delta = (2\rho/\omega\mu)^{1/2} \tag{1}$$

wherein ω: the angular frequency of the high-frequency power (=2πf (f: frequency)), ρ: the resistivity of the electrode plate, and μ: the magnetic permeability of the electrode plate.

The electrode plate 23 is formed of a conductor or a semiconductor such as Si or SiC. Since the skin depth δ becomes large as the resistance of the electrode plate 23 increases, it is preferable that the electrode plate 23 has a resistivity not less than 0.1 Ω·m in the sight of increasing the skin depth δ more than the thickness of the electrode plate 23. 0.3 to 0.8 Ω·m is more preferable. In order to provide the relatively high resistance to the electrode plate 23, a quantity of dopant of, e.g., B is adjusted when the electrode plate 23 is formed of Si, and a pressure at the time of, e.g., sintering is adjusted when it is formed of SiC.

The processing operation in the plasma processing apparatus 1 including the upper electrode 21 will now be described by taking the case of etching an oxide film formed on the wafer W as an example.

The wafer W as the substrate to be processed is carried into the chamber 2 from the load lock chamber (not shown) after the gate valve 32 is opened, and mounted on the electrostatic chuck 11. Then, when the direct-current voltage is applied from the high-voltage direct-current power supply 13, the wafer W is electrostatically sucked to the electrostatic chuck 11. Then, the gate valve 32 is closed, and a vacuum is drawn to a predetermined degree of vacuum in the chamber 2 by the exhaust system 35.

Thereafter, the valve 28 is opened, and the process gas is led into the upper electrode 21 from the process gas supply source 30 through the process gas supply pipe 27 and the gas inlet opening 26 while adjusting the flow quantity of the process gas by the massflow controller 29. Further, the process gas passes through the discharge hole 24 of the electrode plate 23 and is evenly discharged to the wafer W as indicated by an arrow illustrated in FIG. 1, and the inside of the chamber 2 is maintained at a predetermined pressure. Then, a high frequency of 27 to 150 MHz, e.g., 60 MHz is applied from the first high-frequency power supply 40 to the upper electrode 21. As a result, a high-frequency electric field is generated between the upper electrode 21 and the susceptor 5 as the lower electrode, and the process gas dissociates and is turned to the plasma.

On the other hand, a high frequency of 1 to 4 MHz, e.g., 2 MHz is applied from the second high-frequency power supply 50 to the susceptor 5 as the lower electrode. As a result, the ion in the plasma is drawn to the susceptor 5 side, and the anisotropy of etching is increased by the ion assist.

In this manner, by increasing the frequency of the high frequency applied to the upper electrode 21 higher than 27 MHz, the plasma density can be increased, but the electric field becomes uneven on the lower surface of the electrode plate by the influence of the inductance on the electrode surface in the radial direction when increasing the application frequency in the conventional upper electrode structure.

Figure 4:
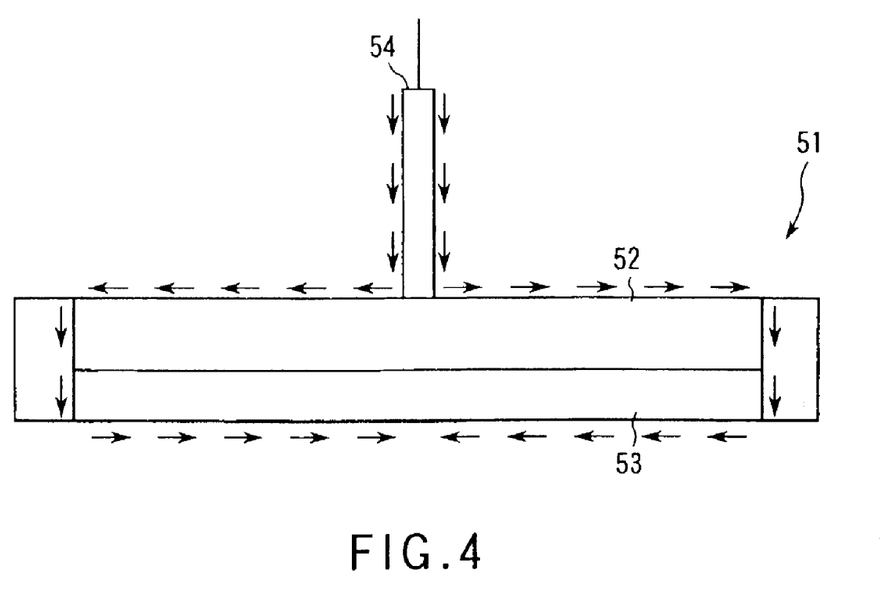
FIG. 4 is a cross-sectional view typically showing a supply system path of high-frequency power in the conventional upper electrode.
Figure 5:
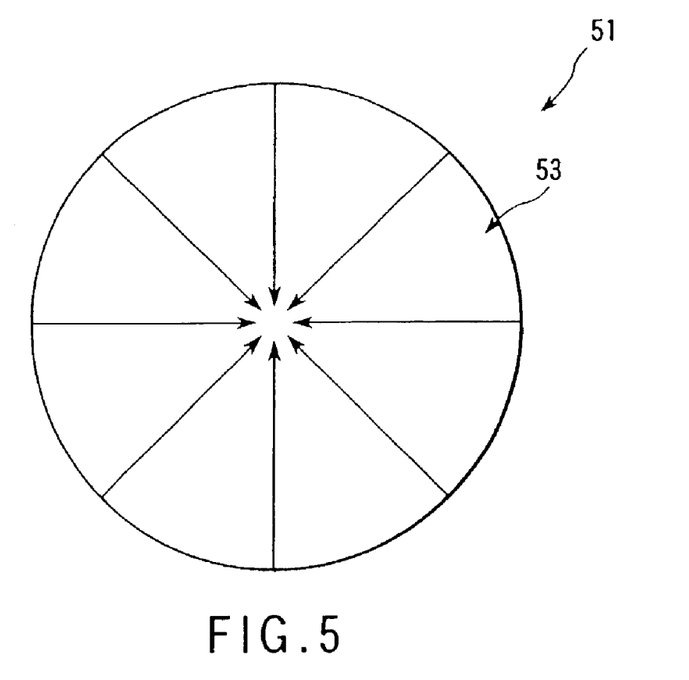
FIG. 5 is a bottom view typically showing a supply system path of high-frequency power in the conventional upper electrode.

A factor causing such unevenness of the electric field will now be described with reference to FIGS. 4 and 5. The electrode plate 73 of the conventional electrode 71 has a resistivity of approximately 0.02 Ω·m. When the high-frequency current supplied from the high-frequency power supply through the feeder rod 74 has a high frequency, the power is supplied to only the surface of the electrode due to the skin effect. As the passage, as shown in FIG. 4, the high-frequency power reaches the lower surface of the electrode plate 73 as the plasma contact surface through the surface of the feeder rod 74, the upper surface of the electrode support 72, the side surface of the electrode support 72 and the side surface of the electrode plate 73.

In this case, since the feeder rod 74 exists at the center of the upper electrode, the power has the same phase everywhere in the edge portion of the lower surface of the electrode plate 73. As shown in FIG. 5, since the power is gradually supplied from the edge portion of the electrode plate 73 toward the center with the same phase, there is generated a phase difference d/λ (λ is a wavelength of an electrode surface wave, and d is a radius of the electrode) at the center of the electrode plate 73 and the edge portion. When the frequency to be applied becomes high, the inductance of the lower surface of the electrode plate 73 in the radial direction cannot be ignored, and the electric field intensity at the center of the lower surface of the electrode plate 73 becomes higher than the electric field intensity of the edge portion by the interferential action due to the phase difference. Furthermore, since the central position is in contact with the plasma, it is an open end in terms of the RF equivalent circuit. Therefore, the electric field at the center becomes stronger on the lower surface of the electrode plate 72, and stationary unevenness is generated in the electric field distribution. As a result, the electric field distribution supplied to the plasma becomes uneven, thereby forming an uneven plasma.

On the contrary, in this embodiment, as shown in FIG. 2 as the first example of the upper electrode 21, the dielectric member 61 is provided at the center of the surface of the electrode plate 23 on the back side, and the dimensions and dielectric constant of the dielectric member 61 are determined in such a manner that the resonance is generated at a frequency of the high-frequency power supplied to the upper electrode 21, thus an electric field orthogonal to the electrode plate 23 is generated. Furthermore, as a second example of the upper electrode 21, as shown in FIG. 3, the cavity portion 62 is provided at the center of the electrode plate 23 of the electrode support 22 on the back side, and a dimension of the cavity portion 62 is determined in such a manner that the resonance is generated at a frequency of the high-frequency power supplied to the upper electrode 21 and the electric field orthogonal to the electrode plate 23 is produced. When the resonance is generated to the dielectric member 61 or the cavity portion 62 and the electric field orthogonal to the electrode plate 23 is produced in this manner, the electric field of the dielectric member 61 or the cavity portion 62 and the electric field of the electrode 23 are coupled, and the electric field of the electrode plate 23 directly below the dielectric member 61, namely, at the center of the electrode can be controlled by the electric field of the dielectric member 61 or the cavity portion 62. Moreover, the electric field distribution on the lower surface of the electrode plate 23 can become even, thereby forming an even plasma.

This point will now be described in detail.

When the skin depth δ becomes larger than the thickness of the electrode plate 23, the electric field transmits through the electrode plate 23. For example, if the frequency of the high-frequency power is 60 MHz and the thickness of the electrode plate 23 is 10 mm, the skin depth δ becomes 10 mm or larger when the resistivity becomes not less than 0.1 Ω·m. At this moment, both the dielectric member 61 in the first example and the cavity portion 62 in the second example are surrounded by the conductor. When the dielectric is surrounded by the conductor in this manner, a resonance is generated at a frequency determined by its dimensions and dielectric constant. Moreover, the cavity portion functions as a dielectric having the relative dielectric constant 1, and resonance is generated at the frequency determined by its dimensions.

For example, when the dielectric member 61 or the cavity portion 62 has a discoid shape, the resonance frequency is determined by its diameter and thickness. Here, where the cylindrical cavity portion having a height L and a radius a is formed on the back side of the electrode plate 23, a radian frequency $\omega_0$ in the resonance can be obtained by the following expression (2):

$$(\omega_0/c)^2 = k_1^2 + n^2\pi^2/L^2 \qquad (2)$$

wherein c is a light velocity in the medium, k1 is Jm' ($k_{1a}$)=0 in the TE mode, which can be obtained from the root of Jm(k1a)=0 in the TM mode. Here, Jm is the Bessel function, and Jm' is differentiation of the Bessel function.

Now, considering the resonance of the cavity portion 62 in the $TM_{010}$ mode in the TM modes that the electric fields become orthogonal on the upper and lower surfaces of the thin discoid hollow and the electric field intensity becomes maximum at the center of the disc, since n=0 and $K_{1a}=2.4$, the following expression (3) can be attained:

$$\omega_0 \times ck1 = c(2.4/a) \quad (3)$$

Assuming that the resonance frequency is $f_0$, since $\omega_0=2\pi f_0$, the following expression (4) can be achieved by the expression (3):

$$f_0=(c/2\pi)\cdot(2.4/a) \quad (4)$$

Assuming that the medium of the cavity portion is a vacuum, the resonance frequency $f_0$ has the GHz order when the radius a is approximately 100 mm.

When using the dielectric member 61 instead of the cavity portion 62, the resonance frequency $f_0$ is represented by the following expression (5) using v expressed by $v=1/(\epsilon\mu)^{1/2}$ in place of c in the expression (4):

$$f_0=(1/((\epsilon\mu)^{1/2}\cdot 2\pi))\cdot(2.4/a) \quad (5)$$

wherein $\epsilon$ is a relative dielectric constant of the dielectric member 61 and $\mu$ is a magnetic permeability of the dielectric member 61.

However, since the dielectric member 61 and the cavity portion 62 are surrounded by the resistor (electrode with a high resistance), the propagation velocity of the electromagnetic wave is slow, and the resonance frequency becomes low. Further, the value Q of the $TM_{010}$ mode is given by the following expression (6), and the value Q becomes small when the skin depth $\delta$ is large, as in this embodiment.

$$Q=1/\delta\{(1/a)+(1/L)\} \quad (6)$$

Figure 6:
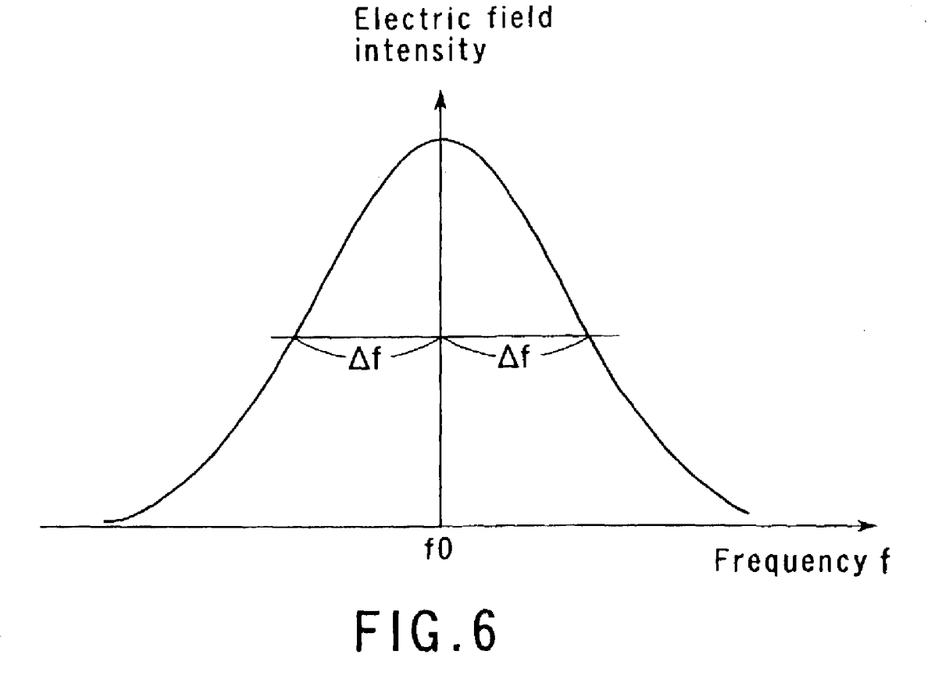
FIG. 6 is a view for illustrating the relationship between a resonance frequency and a value Q.

On the other hand, although the electric field intensity formed to the dielectric member 61 or the cavity portion 62 is distributed around the resonance frequency $f_0$ as shown in, e.g., FIG. 6, the value Q can be represented by the following expression (7) when a half-value width is determined as $\Delta f$ in this graph.

$$Q=f_0/2\Delta f \quad (7)$$

Therefore, the value Q becomes small as the half-value width $\Delta f$ is increased. That is, when the skin depth $\delta$ is large and the value Q is small, the half-value width $\Delta f$ in the graph illustrated in FIG. 6 becomes large, and the electric field intensity distribution formed to the dielectric member 61 or the cavity portion 62 becomes broad. Accordingly, it can be considered that the electromagnetic field in the resonance mode of $TM_{010}$ is excited at a frequency of approximately 60 MHz which is much lower than the resonance frequency $f_0$.

Figure 7:
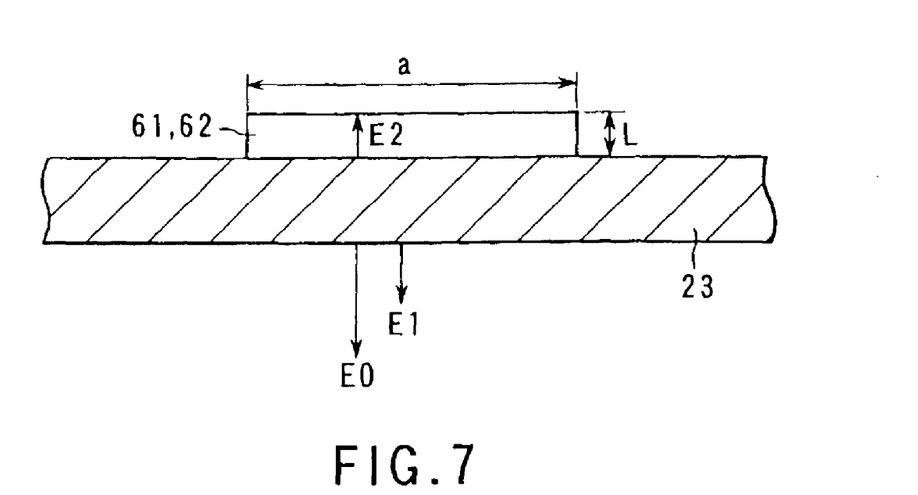
FIG. 7 is a view for illustrating electric field intensities of an electrode plate and a dielectric member or a cavity portion.

When the resonance is generated in the dielectric member 61 or the cavity portion 62 and the electric field orthogonal to the electrode plate 23 is generated, the electric field in the dielectric member 61 or the cavity portion 62 is coupled with the electric fields on the front and back sides of the electrode plate 23. In this case, as shown in FIG. 7, assuming that $E_0$ is the electric field intensity on the surface of the electrode plate 23 when the dielectric member 61 or the cavity portion 62 is not provided, $E_1$ is the electric field intensity on the surface of the electrode plate 23 directly below the part where the dielectric member 61 or the cavity portion 62 exists in the electrode plate 23, and $E_2$ is the electric field intensity generated to the dielectric member 61 or the cavity portion 62, since $E_1=E_0+E_2$ can be attained in terms of algebra, the electric field intensity in the electrode plate 23 directly below the part where the dielectric member 61 or the cavity portion 62 exists can be suppressed as compared with other parts. The electric field intensity $E_2$ in this case can be adjusted by using a thickness L and a radius a of the dielectric member 61 or the cavity portion 62, a resistivity of the electrode plate, a relative dielectric constant of the dielectric member or the like.

By adjusting the electric field of the dielectric member 61 or the cavity portion 62 in this manner, the electric field in the electrode plate 23 directly below the dielectric member 61, namely, the electric field at the center of the electrode can be controlled, and the electric field distribution on the lower surface of the electrode plate 23 can be set even.

Since it is possible to use the upper electrode 21 having the above-described structure to eliminate the problem of unevenness of the electric field distribution generated when the frequency of the high frequency to be applied becomes high and the plasma density is increased, an even plasma with high density can be formed. Therefore, in the plasma etching apparatus as in this embodiment, evenness of etching can be improved, and it is possible to cope with further refinements of the design rules. In particular, the above-described problem is apt to occur when the application frequency is not less than 27 MHz and the plasma density is not less than $1\times10^{11}/cm^3$, then, the upper electrode structure mentioned above is specifically effective.

Description will now be given as to a simulation result when the cavity portion is formed on the back side of the electrode plate of the upper electrode.

Figure 8:
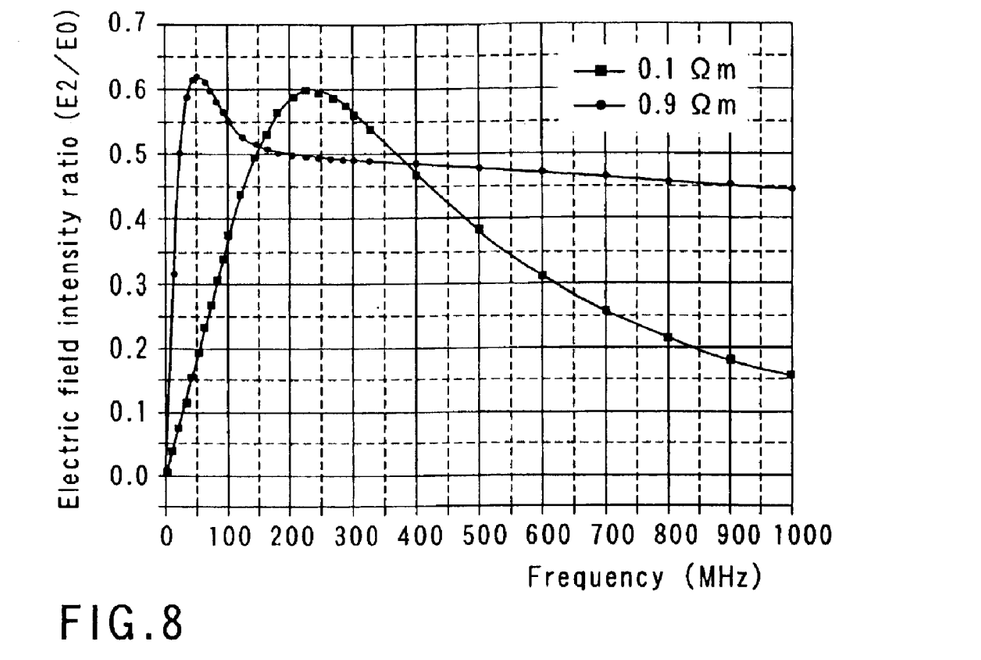
FIG. 8 is a view showing a result of simulating the relationship between a frequency and an electric field intensity ratio $E_2/E_0$.

First of all, where the cavity portion (vacuum) having $\phi$ 140 mm and a thickness of 1 mm was formed, simulation was carried out with respect to the relationship between the frequency and the electric field intensity when resistivitys of the electrode plate were 0.1 $\Omega\cdot m$ and 0.9 $\Omega\cdot m$. FIG. 8 shows the results. FIG. 8 is a graph having a horizontal axis representing frequency and a vertical axis representing electric field intensity ratio $E_2/E_0$ (see FIG. 7) at the part where the cavity portion is formed, and shows the relationship between them. Based on this graph, it can be understood that the frequency at which the ratio of the electric field generated in the cavity portion becomes large is shifted to the low-frequency side by increasing the resistivity value.

Figure 9:
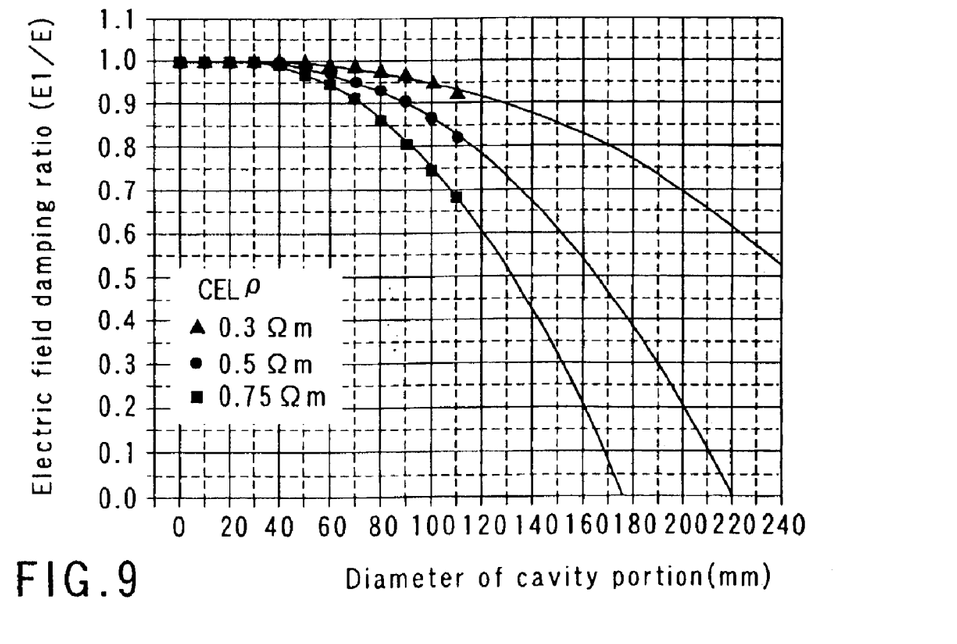
FIG. 9 is a view showing an example of a result of simulating the relationship between a diameter of the cavity portion and an electric field damping ratio $E_1/E_0$ at a electrode plate center position.

Furthermore, simulation was conducted with respect to the relationship between the diameter of the cavity portion and damping of the electric field at the center of the electrode when the resistivity value of the electrode and the diameter of the cavity portion were changed. At this moment, it was presumed that the frequency of the high-frequency power is 60 MHz, the relative dielectric constant is 1, and the thickness of the cavity portion is 1 mm. FIG. 9 shows the results. FIG. 9 is a graph having a horizontal axis representing the diameter of the cavity portion and a vertical axis representing the electric field damping ratio $E_1/E_0$ (see FIG. 7) at the center of the electrode plate, and shows the relationship between them when the resistivity values of the electrode were 0.3, 0.5 and 0.75 $\Omega\cdot m$. Based on this graph, it can be confirmed that the electric field damping capacity at the center of the electrode plate is large as the resistivity of the electrode is high, damping of the electric field is generated from the diameter of the cavity portion where the electric field damping is smaller.

Figure 10:
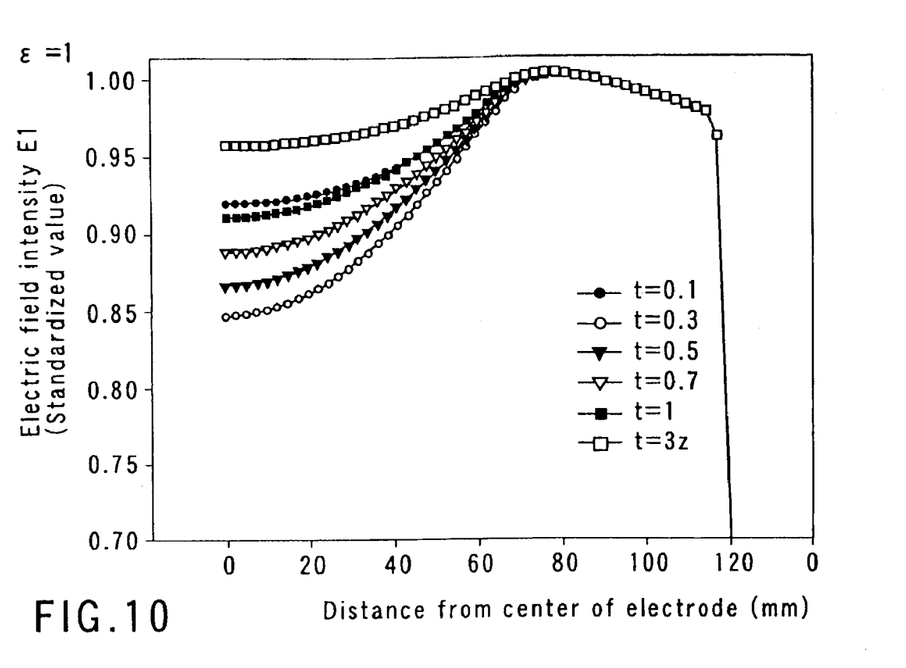
FIG. 10 is a view showing an electric field intensity distribution when a thickness of the cavity portion is changed.

Moreover, simulation was carried out with respect to the electric field intensity distribution on the surface of the electrode when the thickness of the cavity portion was changed. At this moment, it was presumed that the diameter of the cavity portion is 140 mm, the relative dielectric constant of the cavity portion is 1, the resistivity of the electrode plate is 0.75 Ω·m, and the frequency is 60 MHz. FIG. 10 shows the results. FIG. 10 is a graph having a horizontal axis representing a distance from the center of the electrode and a vertical axis representing an electric field intensity $E_1$ (see FIG. 7) of the electrode plate, and showing the electric field intensity distribution when the thickness of the cavity portion was changed. Based on this drawing, it can be understood that the electric field suppression effect can be obtained from the distance up to 80 mm from the electrode center, and the effect to suppress the electric field intensity is changed depending on the thickness of the cavity portion. Here, there was obtained a result that the effect can be obtained when the thickness of the cavity portion is 0.1 to 3 mm and the maximum effect can be obtained when it is 0.3 to 0.5 mm.

Figure 11:
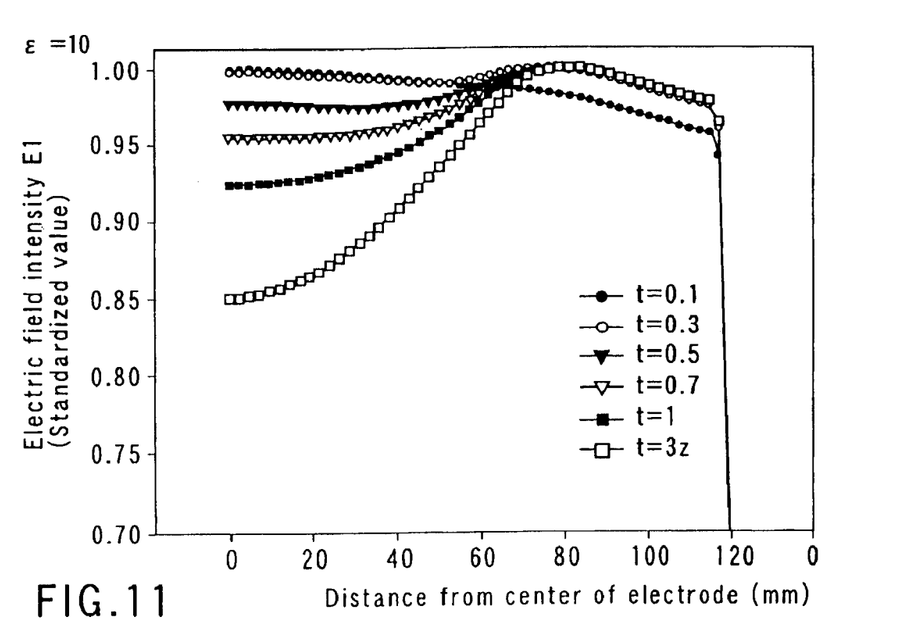
FIG. 11 is a view showing an electric field intensity distribution when a thickness of the dielectric member is changed.

In addition, simulation was carried out with respect to the electric field intensity distribution on the surface of the electrode when the dielectric member was used instead of the cavity portion and the thickness of the dielectric was changed. At this moment, it was presumed that the diameter of the dielectric member is 140 mm, the relative dielectric constant of the dielectric member is 10, the resistivity of the electrode plate is 0.75 Ω·m, and the frequency is 60 MHz. FIG. 11 shows the results. FIG. 11 is a graph having a horizontal axis representing a distance from the center of the electrode and a vertical axis representing an electric field intensity $E_1$ (see FIG. 7) of the electrode plate, and shows an electric field intensity distribution when the thickness of the dielectric member is changed. Based on this graph, it can be understood that the electric field suppression effect can be obtained from the distance up to 60 mm from the electrode center and the effect to suppress the electric field is changed according to the thickness of the cavity portion. Here, there was obtained a result that the effect is large in an area where the thickness of the dielectric member is 1 to 3 mm which is larger than that of the cavity portion. Therefore, the thickness of the dielectric member is preferably set to 1 mm or above, or more preferably 1 to 3 mm. Additionally, the diameter of each of the cavity portion and the dielectric member is larger than 50 mm and smaller than the diameter of the wafer.

Description will now be given as to the results of an experiment using the upper electrode creased based on the present invention. The apparatus illustrated in FIG. 1 was used, and resistivity values of the electrode plate were 0.5 Ω·m and 0.75 Ω·m. The oxide film of the wafer, which is 200 mm, was etched with $C_4H_8$ gas by using an electrode having no cavity portion formed on the back side thereof and an electrode having the cavity portion whose thickness is fixed to 1 mm and whose diameter is determined as 50 mm, 100 mm, 140 mm and 240 mm. The frequency of the high-frequency power was 60 MHz.

Figure 12:
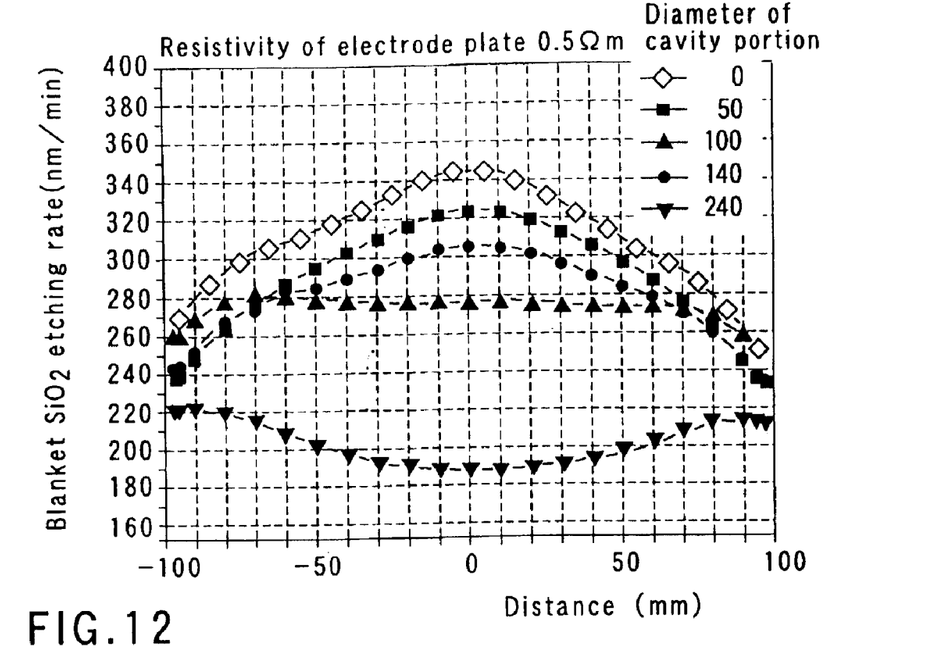
FIG. 12 is a view showing a first example of an etching rate distribution according to the embodiment.
Figure 13:
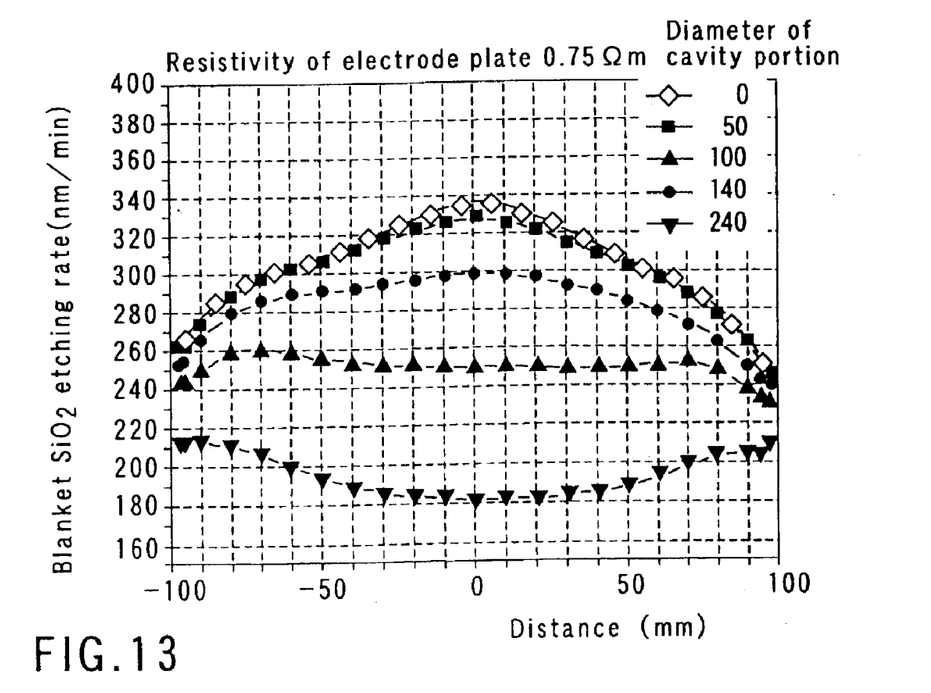
FIG. 13 is a view showing a second example of the etching rate distribution according to the embodiment.

FIGS. 12 and 13 show the results. These graphs each show the etching rate distribution when the resistivity of the electrode plate is 0.5 Ω·m and 0.75 Ω·m. It can be seen that the etching rate becomes high at the center of the wafer when the cavity portion is not formed on the back side of the electrode plate, but the etching rate tends to be lowered at the center of the wafer by forming the cavity portion having the diameter of not less than 50 mm on the back side of the electrode plate. Further, in all cases, it was confirmed that the etching rate is substantially even and the etching rate is high when the diameter of the cavity portion is 100 mm. It was confirmed that the etching rate at the center of the wafer became lower than the etching rate at the peripheral portion of the wafer when the diameter of the cavity portion is 240 mm, which is larger than the diameter of the wafer.

The present invention is not restricted to the foregoing embodiments and various modifications are possible. For example, although the high frequency is applied to the upper and lower electrodes in the foregoing embodiments, the high frequency may be applied to only the upper electrode. Furthermore, although description is based on a high frequency of 27 to 150 MHz applied to the upper electrode, the present invention is not restricted to this range. Furthermore, although a semiconductor wafer is used as the substrate to be processed and etching is applied to this semiconductor wafer, the present invention is not restricted thereto, and any other substrate such as a liquid crystal display (LCD) substrate may be used as the target object to be processed. Also, the plasma processing is not restricted to etching, and any other processing such as sputtering or CVD may be utilized.

Moreover, although the dielectric member 61 and the cavity portion 62 are provided at the center of the electrode support 22 in this embodiment as shown in FIGS. 2 and 3, the present invention is not restricted thereto, and they may be provided at the center of the electrode plate 23 side which comes into contact with the electrode support 22 (surface side coming into contact with the electrode support 22). In addition, although the dielectric member 61 is formed so as to be exposed on one surface of the electrode support 22 in this embodiment, it may be formed inside so as not to be exposed. The cavity portion 62 is formed to a hole opened to the electrode support 22 and the electrode plate 23 is fitted therein, thus forming the cavity portion 62. However, the cavity portion may be formed inside the electrode support 22. This can be also applied to the case where the cavity portion is formed on the electrode plate 23 side.

As described above, according to this embodiment, the dielectric member is provided to the recess portion at the center of the conductive support provided on the surface of the electrode plate opposite to the second electrode side, the dimensions or dielectric constant of the dielectric member being determined in such a manner that the resonance is generated at a frequency of the high-frequency power to be supplied and an electric field orthogonal to the electrode plate is produced. Alternatively, the cavity portion is provided at the center of the conductive support provided on the surface of the electrode plate opposite to the second electrode side, the dimensions of the cavity portion being determined in such a manner that an electric field orthogonal to the electrode plate is generated. When resonance is generated in such a dielectric member or cavity portion and an electric field orthogonal to the electrode plate is produced, the electric field of the dielectric member or the cavity portion is coupled with the electric field of the electrode, and the electric field intensity of the electrode plate directly below the dielectric member or directly below the cavity portion, namely, the electric field at the center of the electrode can be controlled by the electric field of the dielectric member or the cavity portion. Therefore, the electric field distribution on the surface of the electrode can be made even, and evenness of the plasma can be improved.

The present invention provides a technique utilized in a plasma processing apparatus which carries out plasma processing with respect to a semiconductor substrate or the like by using the high-density plasma suitable for further refinement. This plasma processing apparatus achieves evenness of the plasma when using the high-density plasma and enables the finer plasma processing technique by arranging in the electrode the dielectric or the cavity portion by which the resonance is generated at a frequency of the high-frequency power supplied to the electrode and the electric field orthogonal to the electrode plate is generated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus having a chamber in which a pressure is reduced by an exhaust system and which is used for applying a plasma processing to a substrate to be processed held by a second electrode in a process gas atmosphere between a first electrode and the second electrode provided so as to be opposed to each other in parallel by using a plasma generated by high-frequency power, wherein the first electrode comprising:

a conductive support which is held in the chamber by interposing an insulator and has a process gas introduction/diffusion function and a high-frequency power introduction function;

an electrode plate of a flat plate formed by a conductor or a semiconductor joined to a surface of the support opposed to the second electrode; and a cavity portion formed at the center of a surface of the support joined to the electrode plate, the cavity portion having a uniform thickness.

2. The plasma processing apparatus according to claim 1, wherein a skin depth δ represented by the following expression (1) is larger than a thickness of the electrode plate:

$$\delta = (2\rho/\omega\mu)^{1/2} \quad (1)$$

wherein ω: an angular frequency of high-frequency power (=2πf (f: frequency)), ρ: a resistivity of the electrode plate, and μ: a magnetic permeability of the electrode plate.

3. The plasma processing apparatus according to claim 2, wherein a resistivity of the electrode plate is not less than 0.1 Ω·m.

4. The plasma processing apparatus according to claim 3, wherein a resistivity of the electrode plate is 0.3 to 0.8 Ω·m.

5. The plasma processing apparatus according to claim 1, wherein the electrode plate forms a discoid tabular shape and has an opposed surface having an area exceeding a processing surface of the substrate to be processed.

6. The plasma processing apparatus according to claim 1, wherein high-frequency power to the first electrode is a frequency within a range of 27 to 150 MHz, and supplied from the center of a surface of the support which is not opposed to the second electrode.

7. The plasma processing apparatus according to claim 1, wherein a thickness of the cavity portion is uniform, and falls within a range of 0.3 to 0.5 mm.

8. The plasma processing apparatus according to claim 1, wherein a diameter of the cavity portion is 50 mm or more.

9. The plasma processing apparatus according to claim 1 wherein, a dimension of the cavity portion being determined in such a manner that a resonance is generated at a frequency of high-frequency power to be supplied and an electric field orthogonal to the electrode plate is produced.

10. A plasma processing apparatus having a chamber in which a pressure is reduced by an exhaust system and which is used for applying a plasma processing to a substrate to be processed held by a second electrode in a process gas atmosphere between a first electrode and the second electrode provided so as to be opposed to each other in parallel by using a plasma generated by high-frequency power, wherein the first electrode comprising:

a conductive support which is held in the chamber by interposing an insulator and has a process gas introduction/diffusion function and a high-frequency power introduction function;

an electrode plate of a flat plate formed by a conductor or a semiconductor joined to a surface of the support opposed to the second electrode; and a cavity portion formed at the center of a surface of the electrode plate joined to the support, the cavity portion having a uniform thickness.

11. A plasma processing apparatus having a chamber in which a pressure is reduced by an exhaust system and which is used for applying a plasma processing to a substrate to be processed held by a second electrode in a process gas atmosphere between a first electrode and the second electrode provided so as to be opposed to each other in parallel by using a plasma generated by high-frequency power, wherein the first electrode comprising:

a conductive support which is held in the chamber by interposing an insulator and has a process gas introduction/diffusion function and a high-frequency power introduction function;

an electrode plate of a flat plate formed by a conductor or a semiconductor joined to a surface of the support opposed to the second electrode; and a cavity portion formed at the center of a surface of the support joined to the electrode plate, wherein a skin depth δ represented by the following expression (1) is larger than a thickness of the electrode plate:

$$\delta = (2\rho/\omega\mu)^{1/2} \quad (1)$$

wherein ω: an angular frequency of high-frequency power (=2πf (f: frequency)), ρ: a resistivity of the electrode plate, and μ: a magnetic permeability of the electrode plate.

12. The plasma processing apparatus according to claim 11, wherein a resistivity of the electrode plate is not less than 0.1 Ω·m.

13. The plasma processing apparatus according to claim 12, wherein a resistivity of the electrode plate is 0.3 to 0.8 Ω·m.

14. A plasma processing apparatus having a chamber in which a pressure is reduced by an exhaust system and which is used for applying a plasma processing to a substrate to be processed held by a second electrode in a process gas atmosphere between a first electrode and the second electrode provided so as to be opposed to each other in parallel by using a plasma generated by high-frequency power, wherein the first electrode comprising a conductive support which is held in the chamber by interposing an insulator and has a process gas introduction/diffusion and a high-frequency power introduction function;

an electrode plate which is formed by a conductor or a semiconductor, the electrode plate constituting a surface opposed to the second electrode, and a cavity portion formed in the first electrode and having a uniform thickness to suppress an electric field intensity of the part underneath the cavity portion.

15. The plasma processing apparatus according to claim 14, wherein a skin depth δ represented by the following expression (1) is larger than a thickness of the electrode plate $$\delta = (2\rho/\omega\mu)1/2 \quad (1)$$

wherein ω an angular frequency of high-frequency power (=2πf (f: frequency)), ρ: a resistivity of the electrode plate, and μ a magnetic permeability of the electrode plate.

16. The plasma processing apparatus according to claim 15, wherein a resistivity of the electrode plate is not less than 0.1 Ω.m.

17. The plasma processing apparatus according to claim 15, wherein a resistivity of the electrode plate is 0.3 to 0.8 Ω m.

18. The plasma processing apparatus according to claim 14, wherein the electrode plate forms a discoid tabular shape and has an opposed surface having an area exceeding a processing surface of the substrate to be processed.

19. The plasma processing apparatus according to claim 14, wherein high-frequency power to the first electrode is a frequency within a range of 27 to 150 MHz, and supplied from the center of a surface of the support which is not opposed to the second electrode.

20. The plasma processing apparatus according to claim 14, wherein a thickness of the cavity portion is uniform, and falls within a range of 0.3 to 0.5 mm.

21. The plasma processing apparatus according to claim 14, wherein a diameter of the cavity portion is 50 mm or more.

* * * * *